United States Patent [19]
Pfiester

[11] Patent Number: 4,714,519
[45] Date of Patent: Dec. 22, 1987

[54] METHOD FOR FABRICATING MOS TRANSISTORS HAVING GATES WITH DIFFERENT WORK FUNCTIONS

[75] Inventor: James R. Pfiester, Austin, Tex.

[73] Assignee: Motorola, Inc., Schaumburg, Ill.

[21] Appl. No.: 31,304

[22] Filed: Mar. 30, 1987

[51] Int. Cl.[4] ............ H01L 21/306; B44C 1/22; C03C 15/00; C03C 25/06

[52] U.S. Cl. .................................. 437/81; 437/44; 156/648; 156/653; 156/657; 156/662

[58] Field of Search .............. 156/643, 646, 648, 653, 156/657, 659.1, 662; 29/571, 576 B, 576 W, 580, 591; 148/1.5, 187; 357/23.1, 23.14, 41–44

[56] References Cited

U.S. PATENT DOCUMENTS

| | | |
|---|---|---|
| 4,559,694 | 12/1985 | Yoh et al. .............................. 29/571 |
| 4,577,391 | 3/1986 | Hsia et al. ............................. 29/571 |
| 4,597,824 | 7/1986 | Shinada et al. ..................... 156/643 |
| 4,678,537 | 7/1987 | Ohuchi ................................. 156/643 |

*Primary Examiner*—William A. Powell
*Attorney, Agent, or Firm*—John A. Fisher; Jeffrey Van Myers; David L. Mossman

[57] ABSTRACT

A process for forming an insulated gate field effect transistor (IGFET) having a semiconductor gate with a central portion and end portions on either side thereof where the portions are of two different conductivity types. Typically, a central portion of the gate, such as a doped polysilicon portion of a first conductivity type, is flanked by end portions near the source/drain regions, where the end portions are doped with an impurity of a second conductivity type. The central portion of the gate is formed by conventional gate patterning whereas the end portions are formed by typical procedures for forming sidewall spacers using a conformal layer of in situ doped polycrystalline silicon (polysilicon) or other semiconductor material and an anisotropic etch.

11 Claims, 7 Drawing Figures

METHOD FOR FABRICATING MOS TRANSISTORS HAVING GATES WITH DIFFERENT WORK FUNCTIONS

CROSS-REFERENCE TO RELATED APPLICATIONS

The present application is related to U.S. Patent application Ser. No. 031,302, filed Mar. 31, 1987, relating to short-channel insulated gate, metal-oxide-semiconductor transistors having gates with different work functions which provide a variable flatband voltage; as well as to U.S. patent application Ser. No. 031,301, filed Mar. 30, 1987, relating to another particular kind of short-channel insulated gate, metal-oxide-semiconductor transistor; and U.S. Patent application Ser. No. 031,299, filed Mar. 30, 1987, relating to another particular method for making the devices of the applications Ser. Nos. 031,301 and 031,302.

FIELD OF THE INVENTION

The invention relates to methods for fabricating insulated gate field effect transistor (IGFET) device structures, and relates more particularly to processes for making IGFETs having multiple work functions.

BACKGROUND OF THE INVENTION

Insulated gate field effect transistors (IGFETs), and the subclass of metal-oxide-semiconductor (MOS) FETs are well-known in the art of designing and fabricating integrated circuits. For example, FIG. 2 illustrates a prior art n-channel MOS transistor 10 in a p⁻ semiconductor substrate 12 having n+ source/drain regions 14 and 16, covered by a thin gate dielectric layer 18 upon which rests a gate 20 of conductive material. The channel under the gate 20 between the source and drain 14 and 16 has a length, L, that the carriers travel between the source and drain regions 14 and 16. The field effect transistor 10 of FIG. 2 has a significant disadvantage in that the threshold voltage, $V_T$, usually varies with respect to geometry, the channel length L measured in the direction X, and the drain bias.

For long channel field effect devices, the device can be designed so that this problem can be minimized or ignored. However, as L decreases, there is a considerable problem with a diminishing $V_T$, such as in seen schematically in curve A of FIG. 3. For a longer length $L_1$, $V_T$ is fairly well-behaved and constant. However, as L decreases to $L_2$, with conventional devices the $V_T$ drops off appreciably. This effect severely impairs device performance and makes it difficult to design integrated circuits with these short channel lengths. If the curve could be moved out as shown in curve B, then the $V_T$ would not fall off as soon, and the detrimental short channel effects would be alleviated.

Ideally, the $V_T$ vs. L curve should appear more like curve B, that is, flatter for a greater L range, so that $V_T$ remains fairly constant even for very short channel lengths. This depletion layer shape affects the $V_T$ as well. Thus, it would be advantageous to have a field effect or MOS device with a minimum of $V_T$ variation with respect to channel length and the drain bias. It has recently been discovered, by the inventor herein as disclosed in this application, that such devices may be provided by having a FET employing a semiconductor material gate where portions of the gate are doped with impurities of the two different conductivity types. For example, in a specific embodiment, the central portion of a polycrystalline silicon gate may be doped n+ conductivity type and the ends of the gate may be doped p⁻ and p+ conductivity type.

The only publication known which reveals the use of insulated gate field effect transistors having gates of more than one conductivity type electrically connected is U.S. Pat. No. 4,559,694 to Yoh, et al. This patent concerns a method of manufacturing a reference voltage generator device. The gates of the IGFETs have central portions and end portions where the conductivity types of the end portions and the central portions are different. Sometimes the end portions and the central portions of the gate were separated by a portion of intrinsic semiconductor material. However, in all cases described in the patent, the impurity level of the end portions of the gate electrode was the same as the impurity level of the source/drain regions on either side of the entire gate, for they were formed in the same step. Therefore, of course, in all instances the conductivity type of the gate end portions and the source/drain regions are the same. Although channel length dimensions are not mentioned in U.S. Pat. No. 4,559,694, it is expected that they would be considerably longer that those of concern in the present invention to be able to form the voltage reference funtions required.

This characteristic is important because the problems with threshold voltage control discussed above are not apparent until the channel length approaches submicron levels. Of course, the minimum channel length, L, for any particular device, depends on the channel doping level and the gate oxide thickness. Nevertheless, it is expected that only devices with channel lengths longer than about 5 um could be made with the method of U.S. Pat. No. 4,559,694. The fabrication methods taught therein are completely incompatible with devices having channel lengths in the micron to submicron realm, and rely heavily on photolithographic resolution. It is generally recognized that photolithographic resolution techniques reach their limits at about one micron.

It would be advantageous if a method could be discovered for fabricating FETs with semiconductor material gates where different portions of the gates have different conductivity types, and where techniques other than photolithographic techniques are employed for resolving the different portions of the gates.

SUMMARY OF THE INVENTION

Accordingly, it is an object of the present invention to provide a technique for fabricating FETs having minimum threshold voltage variation with respect to channel length and drain bias.

It is yet another object of the present invention to provide a field effect device where the flatband voltage, $V_{FB}$, of the gate is no longer constant, but is a function of distance X across the channel L.

Still another object of the invention is to provide a method for fabricating FETs having gates of semiconductor devices of different conductivity types, where the different portions of the gates are defined by techniques other than photolithographic resolution.

It is yet another object of the present invention to provide a technique for fabricating FETs with gates of different conductivity types where the impurity concentrations in the end portions of the gates and the source/drain regions are different.

In carrying out these and other objects of the invention, there is provided, in one form, a method for fabricating a transistor having a gate with different work functions, which begins by providing a semiconductor substrate over which is formed a layer of gate dielectric material. Next, a doped semiconductor material gate region is provided on the gate dielectric material, where the gate region is doped with an impurity of a first conductivity type. Then, a conformal layer of a doped semiconductor material is formed over the gate region and the gate dielectric material layer, where the conformal layer is doped with an impurity of a second conductivity type. Finally, an anisotropic etch of the conformal layer of doped semiconductor material is performed to leave sidewalls on the gate region, where the gate region forms a central portion of a gate and the sidewalls form end portions of the gate.

It should be noted that the drawings are not to scale, since various of the elements are exaggerated in the vertical dimension relative to the horizontal dimension for clarity.

DETAILED DESCRIPTION OF THE INVENTION

Figure 1:
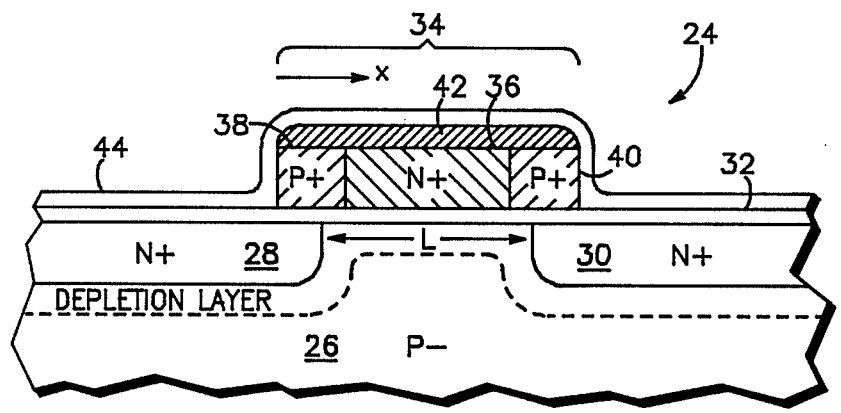
FIG. 1 is a cross-sectional illustration of one embodiment of the field effect transistor having a gate with different work functions made with the process of the present invention.
Figure 2:
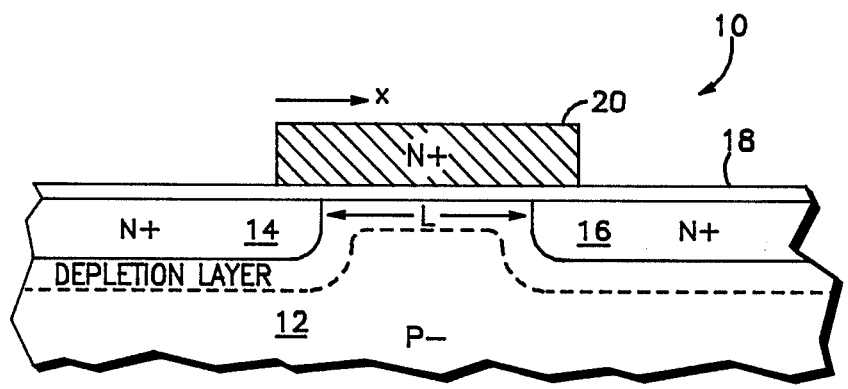
FIG. 2 is a cross-sectional illustration of a conventional field effect transistor for comparison to the FET of FIG. 1.
Figure 3:
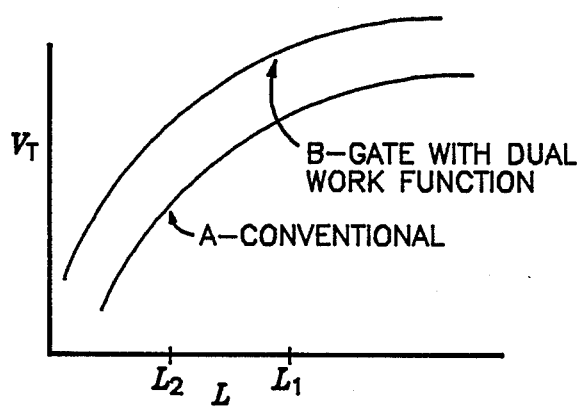
FIG. 3 is qualitative plot of threshold voltage, $V_T$, with effective channel length, L, demonstrating the dependency of $V_T$ with L in accordance with conventional and new field effect devices.

Shown in FIG. 1 is a field effect transistor 24 fabricated within a semiconductor substrate 26 of a first conductivity type. Spaced apart source/drain regions 28 and 30 are regions of the substrate 26 counterdoped to be of a second conductivity type. On the surface of substrate 26 is a gate dielectric layer 32 in turn bearing a gate 34 covering the channel of length L between source/drain regions 28 and 30. One of the distinguishing features of the inventive structure of the present invention is to the gate 34 being of a semiconductive material of two different conductivity types.

For example, in the embodiment illustrated in FIG. 1, there is a central portion 36 of a first conductivity type and end portions 38 and 40 of a second conductivity type. While it is well known to form multiple element gates, as in double polycrystalline silicon dynamic random access memories (DRAMs), the different portions of the gates are always insulated from each other, as contrasted to the structure of the instant invention where the end portions of the gate 38 and 40 are next to and in electrical contact with the central portion of the gate 36.

Of course, it is realized that this structure will form diodes on the ends of the gate, so that it may be necessary to strap the portions 36, 38 and 40 of the gate together with an optional conductive material strap 42 to ensure that all portions of the gate 34 are tied together. The FET 24 may also have an insulating dielectric layer 44 to insulate the gate 34 from the other elements of the integrated circuit.

The particular FET 24 illustrated in FIG. 1 is an n-channel device where the substrate 26 is p$^-$ conductivity type and the source/drain regions 28 and 30 are of n+ conductivity type. It is anticipated that the device of the present invention would also function as expected were the conductivity types to be reversed. See, for example, FIGS. 6 and 7 where the central portion 36 of the gate 34 is p+ and the end portions 38 and 40 are n+, which is the reverse of the case seen in FIG. 1. The end portions 38 and 40 in FIGS. 6 and 7 may be n$^-$ and n+ doped and is not limited to n+.

In the present description, however, the central portion 36 of the gate 34 is a different conductivity type from that of the substrate 26, in other words, the same conductivity type from the source/drain regions 28 and 30. Stated another way, if the substrate 36 is of p conductivity type, the central portion 36 of gate 34 should be n conductivity type, and if the substrate 26 is n type, the central portion 36 should be also be p type. Of course, the gate end portions 38 and 40 are to be of the opposite conductivity type of the central portion 36.

Further, for the purposes of illustration only, it will be understood that semiconductor substrate 26 is monocrystalline silicon, that the gate 34 is polycrystalline silicon or polysilicon, and that the gate dielectric material 32 is silicon dioxide, or simply oxide. Other suitable materials may be used for these and the device would have a structure and function similar in kind to that of the present invention.

Figure 6:
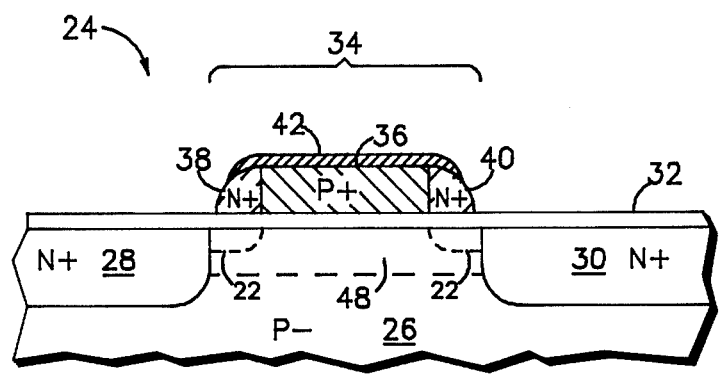
Figure 7:
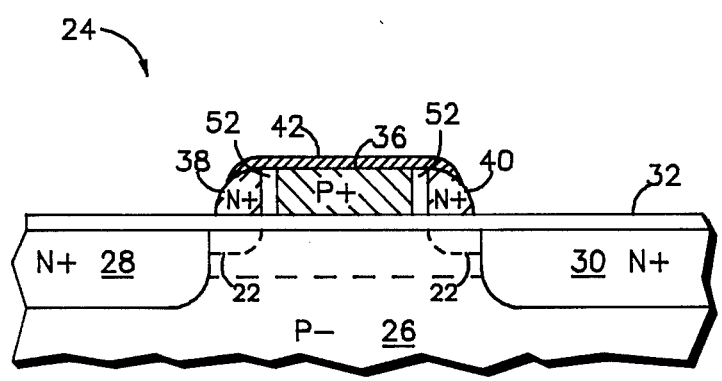
FIG. 7 is a cross-sectional illustration of another FET having a gate with two work functions made in accordance with another embodiment of the process of the present invention.

With respect to the performance of the inventive device, the extra end portions 38 and 40 provide a different work function on the end of the gate 34 from that in the central part of the gate 36. As shown in FIGS. 6 and 7, three types of gates are tied together, the central region 36 having p+ doping, while the end portions 28 and 40 have n+ doping. End gate portions 38 and 40 may also be of a lesser impurity level, n$^-$ doped semiconductor material as well.

The edge portion 38 and 40 $V_T$s may be approximately 1 V higher than that of the center portion 36. Since the edge $V_T$ determines overall device $V_T$, channel doping in the center of the channel can be lower. This device, shown in FIG. 1 improves the $V_T$ vs. L curve due to the variable work function along the direction X. The lower center channel doping provides high carrier mobility and lower body effect, sometimes expressed as $V_T$ vs. $V_{SB}$. The exact impurity levels of the various regions 28, 30, 36, 38 and 40 must be optimized by one skilled in the art with the other device parameters.

Upon application of a voltage to the gate 34 of n-channel FET 24, inversion layers 22 will be created beneath the end portions 38 and 40, just beneath the gate dielectric layer 32 as shown in FIG. 1. These inversion layers 22 effectively function as source/drain extensions, but do not require an extra structure that consumes lateral area.

However, the behavior is analogous to the use of lightly doped drains (LDDs) in the case where the source/drain regions 28 and 30 and the end portions 38 and 40 are n+ doped and the center portion 36 of the gate 34 is doped p+, as seen in FIGS. 6 and 7. In this case, the edge portions 38 and 40 have a lower $V_T$ than the center portion 36, and therefor they create shallow source/drain extensions 22 which improve short-channel $V_T$ vs. L. characteristics. As will be described, the fabrication of the FET 24 can be conducted in such a way as to take full advantage of the minimum gate length possible with a given process. Additionally, the magnitude of the flatband voltage of the gate 34 is no longer constant across L, but diminishes at both ends.

In the case where the center portion 36 and the source/drain regions 28 and 30 are n+ doped, as shown in FIG. 1, the gate 34 may be thought of as three transistors in series with portions 36, 38 and 40 tied together, but controlling separate devices. The "edge transistors" have a higher $V_T$ than the "central transistor", and so as L decreases, the "effective" $V_T$ of the entire device structure would counteract the charge sharing in the silicon substrate bulk region 26. Thus, $V_T$ would become less dependent on L.

Shown in FIG. 6 is another embodiment of the FET device 24 of the instant invention which involves a semiconductor substrate 26, having source/drain regions 28 and 30 in the substrate 26, and spaced apart by a channel 48. As is conventional, the substrate 26 is covered by a thin gate dielectric material layer 32 upon which is formed a gate 34 having a central portion 36 and end portions 38 and 40. The portions 36, 38 and 40 may optionally be tied together by conductive strap 42. The source/drain regions 28 and 30 are adjacent to inversion layers 22 extending into the channel 48 caused by the end portions 38 and 40 of gate 34. Channel 48 may be formed by a separate implant, such as a phosphorus n-type implant step, or may simply exist in the surface of the substrate 26 when a gate voltage is applied.

By way of illustration only, semiconductor substrate 26 may be monocrystalline silicon, thin gate dielectric material layer 32 may be silicon dioxide and the central portion 36, end portions 38 and 40 and conductive strap 42 may all be doped polycrystalline silicon, although the strap 42 may also be metal, refractory metal silicide or some other conductive material or a combination of these. These particular materials are simply suggestions and are not limiting to the invention. Further, the semiconductor substrate 26 may be p− doped, the source/drain regions 28 and 30 may be n+ doped, while the central portion 36 of the gate 34 may be p+ doped polycrystalline silicon and the gate 34 end portions 38 and 40 may be n+ doped polycrystalline silicon. Again, these doping types and levels are suggested as illustrations, and not as a means of limiting the invention. No doubt other combinations of dopants would be suitable and apparent to one skilled in the art, including reversing all of the conductivity types, which would still permit the device 24 to operate as expected.

Note in the embodiment illustrated in FIG. 6, the use of gate end portions 38 and 40 as extensions to the central portion 36 of the gate 34, similar to the end portions 38 and 40 of the embodiment seen in FIG. 1. In the FIG. 6 embodiment, extensions 38 and 40 are permanent, in situ doped polysilicon extensions, that may need to be strapped with a conductive material strap 42, which may be a refractory metal silicide like titanium silicide. The extensions 38 and 40 also act as sidewall spacer/masks for the implant to form source/drain regions 28 and 30.

Further, in the performance of device 24, the gate extensions 38 and 40 act as permanent n+ features to form inversion layers 22. These inversion layers 22 extend the source/drain regions 28 and 30 to the edges of the channel 48. These inversion layers 22 improve the $V_T$ vs. L curve since less charge sharing occurs in the silicon channel region 48 at the source/drain edges.

The second FET 24 seen in FIG. 6 provides a number of advantages, such as a high transconductance, since the low doping in the center of the channel region provides a lower vertical electric field, thus providing a higher carrier mobility. The body effect may also be reduced since the channel may be relatively lightly doped. As noted earlier, the edge devices effectively determine the $V_T$ of the overall device 24 since the center portion 36 of the gate 34 will have a $V_T$ approximately equal to 0 V, if the device 24 is designed properly. An optional phosphorus or arsenic $V_T$ adjust implant in the channel 48 will also aid in increasing reliability.

Figure 4:
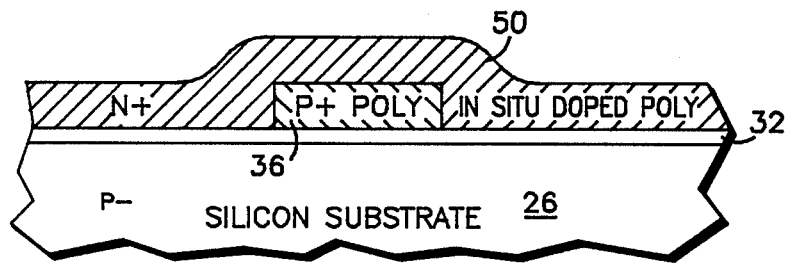
FIGS. 4 through 6 are cross-sectional illustrations of a FET under construction in accordance with the method of fabrication of the present invention.
Figure 5:
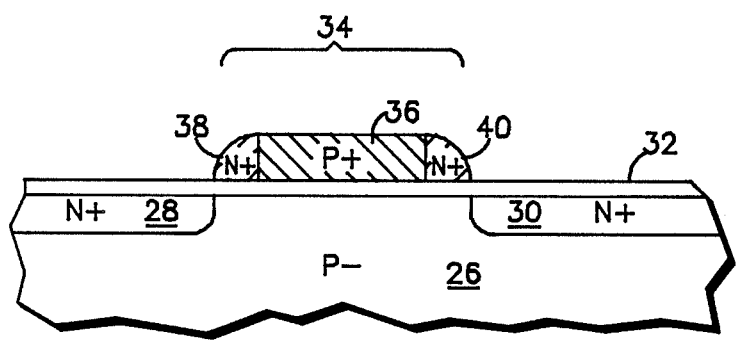

The n-channel FET 24 of the present invention may be made in any number of ways, one of which is illustrated in FIGS. 4 through 6. Similar reference numbers to those used in FIG. 1 will be employed in this discussion for clarity. This process sequence for making the devices of this invention having gates with two work functions will be described in general terms, and then an example of a FET 24 built in accordance with the present method will be described.

As seen in FIG. 4, a semiconductor substrate 26 is provided, here a p− monocrystalline silicon substrate, having a thin silicon dioxide layer 32 thereon which will serve as the gate dielectric layer. A layer of polysilicon is formed and patterned to give the central portion 36 of eventual gate 34. The polysilicon may be p+ doped in situ or after it is formed as a layer, or after the gates are patterned, according to known techniques. Next, a uniform polycrystalline silicon deposition is performed to provide layer 50 seen in FIG. 5. The layer 50, which may advantageously be n+ doped in situ, is then anisotropically etched, such as by reactive ion etching (RIE) to form sidewall end portions 38 and 40, as shown in FIG. 5. The formation of sidewalls around a gate is well known in the art, in general, although the employment to form differently doped gate ends is new. Processing may continue as usual, for example, with forming source/drain regions 28 and 30 by a self-aligned implant against the end portions 38 and 40.

Another optional process step is the formation of an oxide layer 52 on the central portion 36 of gate 34 prior to the formation of a uniform layer of polysilicon 50 thereon. This oxide layer 52 may be desired to minimize the lateral diffusion of the dopants in gate portions 38, 36 and 40. Of course, if this is done, the oxide 52 on the top portion of the central portion 36 of the gate 34 must be removed and the portions 36, 38 and 40 should be electrically connected by a strap 42. This reoxidation may also be necessary to heal the gate oxide 32 after the polysilicon RIE etch patterning the central portion 36, and provide an etch stop during the etch of uniform layer of second polysilicon 50 to minimize etching of the p+ polysilicon gate central portion 36. This oxide layer 52 between the central portion 36 and the end portions 38 and 40 must be relatively thin.

EXAMPLE 1

A very rudimentary version of the n-channel device 24 of the present invention was constructed. The thickness of the silicon oxide gate dielectric 32 was 175 Angstroms and the concentration of impurity in the p− bulk substrate 26 was $2 \times 10^{16}$ cm$^{-3}$. The phosphorus implant in the channel 48 was 1E12 cm$^{-2}$, whereas the arsenic implant in the source/drain regions 28 and 30 was a 5E15 cm$^{-2}$ dose. The central portion 36 of the polysilicon gate 34 contained a 1E16 BF$_2$ dose, and the central portion 36 was separated from 3,000 Angstrom n+ polysilicon sidewalls 38 and 40 by 100 Angstrom thick polysilicon oxide walls 52.

While the device 24 was not optimized as to its performance, it was compared to control devices that were identical, except that the end portions 38 and 40 were not present, thus making the control devices equivalent to prior art FETs. Both 1E12 boron n-channel FETs with V$_{TN}$ of approximately 1.8 V and 1E12 phosphorus with V$_{TN}$ of approximately 0.8 V demonstrated that the change in V$_T$ to V$_{DS}$ varied with respect to L in the correct direction. That is, there was an effective improvement of approximately 0.1 um reduction in the L for a fixed relationship of change in V$_T$ to change in V$_{DS}$. While this is not a monumental result, it does demonstrate that the threshold voltage behavior can be stabilized for smaller devices using the present invention structure.

I claim:

1. A process for fabricating an insulated gate field effect transistor (IGFET) comprising the steps of:
   providing a semiconductor substrate;
   forming a layer of gate dielectric material on the semiconductor substrate;
   providing a doped semiconductor material gate region on the gate dielectric material, the gate region doped with an impurity of a first conductivity type;
   forming a conformal layer of a doped semiconductor material over the gate region and the gate dielectric material layer, the conformal layer doped with an impurity of a second conductivity type; and
   performing an anisotropic etch of the conformal layer of doped semiconductor material to leave sidewalls on the gate region, where the gate region forms a central portion of a gate and the sidewalls form end portions of the gate.

2. The process of claim 1 wherein after the anisotropic etch, an impurity is introduced into the semiconductor substrate using the gate as a mask to form source/drain regions adjacent the gate.

3. The process of claim 1 wherein after the anisotropic etch to form the end portion sidewalls, a conductive material strap is provided over the central portion and the end portions of the gate to electrically connect them together.

4. The process of claim 3 wherein the conductive material strap is selected from the group consisting of metals, doped semiconductor material, refractory metal silicides and combinations thereof.

5. The process of claim 1 wherein a thin dielectric material is formed on the gate region prior to the formation of the conformal doped semiconductor material layer.

6. A process for fabricating an insulated gate field effect transistor (IGFET) comprising the steps of:
   providing a doped semiconductor substrate;
   forming a layer of gate dielectric material on the semiconductor substrate;
   providing a doped semiconductor material gate region on the gate dielectric material, the gate region having sides and top and heavily doped with an impurity of a first conductivity type;
   forming a thin dielectric material on the sides and top of the gate region;
   forming a conformal layer of a doped semiconductor material over the dielectric material layer-covered gate region and the gate dielectric material layer, the conformal layer being heavily doped with an impurity of a second conductivity type;
   performing an anisotropic etch of the conformal layer of doped semiconductor material to leave sidewalls on the gate region, where the gate region forms a central portion of a gate and the sidewalls form end portions of the gate;
   removing the thin dielectric material layer from the top of the gate;
   providing a conductive material strap over the central and end portions of the gate to electrically connect them; and
   introducing an impurity into the semiconductor substrate using the gate as a mask to form heavily doped source/drain regions adjacent the gate.

7. The process of claim 6 wherein the conductive material strap is selected from the group consisting of metals, doped semiconductor material, refractory metal silicides and combinations thereof.

8. A process for fabricating an insulated gate field effect transistor (IGFET) comprising the steps of:
   providing a semiconductor substrate lightly doped with an impurity of a first conductivity type;
   forming a layer of gate dielectric material on the semiconductor substrate;
   providing a doped semiconductor material gate region on the date dielectric material, the gate region having sides and top and heavily doped with an impurity of the first conductivity type;
   forming a thin dielectric material on the sides and top of the gate region;
   forming a conformal layer of a doped semiconductor material over the dielectric material layer-covered gate region and the gate dielectric material layer, the conformal layer being heavily doped with an impurity of a second conductivity type;
   performing an anisotropic etch of the conformal layer of doped semiconductor material to leave sidewalls on the gate region, where the gate region forms a central portion of a gate and the sidewalls form end portions of the gate;
   removing the thin dielectric material layer from the top of the gate;
   providing a conductive material strap over the central and end portions of the gate to electrically connect them; and
   introducing an impurity into the semiconductor substrate using the gate as a mask to form heavily doped source/drain regions adjacent the gate.

9. The process of claim 8 wherein the conductive material strap is selected from the group consisting of metals, doped semiconductor material, refractory metal silicides and combinations thereof.

10. A process for fabricating an insulated gate field effect transistor (IGFET) comprising the steps of:
    providing a monocrystalline silicon substrate lightly doped with an impurity of a first conductivity type;
    forming a layer of gate silicon oxide on the silicon substrate;
    providing a doped polycrystalline silicon gate region on the gate oxide, the gate region having sides and top and heavily doped with an impurity of the first conductivity type;
    forming a thin silicon oxide layer on the sides and top of the gate region;

forming a conformal layer of a doped polycrystalline silicon over the thin silicon oxide-covered gate region and the gate silicon oxide layer, the conformal layer being heavily doped with an impurity of a second conductivity type;

performing an anisotropic etch of the conformal layer of doped polycrystalline silicon to leave sidewalls on the gate region, where the gate region forms a central portion of a gate and the sidewalls form end portions of the gate;

removing the thin silicon oxide layer from the top of the gate;

providing a conductive material strap over the central and end portions of the gate to electrically connect them; and introducing an impurity into the semiconductor substrate using the gate as a mask to form heavily doped source/drain regions adjacent the gate.

11. The process of claim 10 wherein the conductive material strap is selected from the group of materials consisting of metals, doped semiconductor material, refractory metal silicides and mixtures thereof.

* * * * *